(12) United States Patent
Grassmann et al.

(10) Patent No.: US 11,244,886 B2
(45) Date of Patent: Feb. 8, 2022

(54) PACKAGE COOLED WITH COOLING FLUID AND COMPRISING SHIELDING LAYER

(71) Applicant: Infineon Technologies AG, Neubiberg (DE)

(72) Inventors: Andreas Grassmann, Regensburg (DE); Wolfram Hable, Neumarkt (DE); Juergen Hoegerl, Regensburg (DE); Ivan Nikitin, Regensburg (DE); Achim Strass, Munich (DE)

(73) Assignee: Infineon Technologies AG, Neubiberg (DE)

( * ) Notice: Subject to any disclaimer, the term of this patent is extended or adjusted under 35 U.S.C. 154(b) by 94 days.

(21) Appl. No.: 15/710,852

(22) Filed: Sep. 21, 2017

(65) Prior Publication Data
US 2018/0082925 A1    Mar. 22, 2018

(30) Foreign Application Priority Data
Sep. 21, 2016 (DE) ..................... 10 2016 117 843.8

(51) Int. Cl.
*H01L 23/42* (2006.01)
*H01L 23/495* (2006.01)
*H01L 23/552* (2006.01)
*H01L 23/373* (2006.01)
*H01L 23/473* (2006.01)
(Continued)

(52) U.S. Cl.
CPC .......... *H01L 23/42* (2013.01); *H01L 23/3735* (2013.01); *H01L 23/473* (2013.01); *H01L 23/49531* (2013.01); *H01L 23/552* (2013.01); *H01L 23/3121* (2013.01); *H01L 23/49575* (2013.01); *H01L 24/29* (2013.01); *H01L 24/32* (2013.01); *H01L 24/33* (2013.01); *H01L 24/73* (2013.01); *H01L 2224/291* (2013.01); *H01L 2224/32225* (2013.01); *H01L 2224/32245* (2013.01); *H01L 2224/33181* (2013.01); *H01L 2224/48227* (2013.01); *H01L 2224/73265* (2013.01); *H01L 2924/13055* (2013.01); *H01L 2924/13062* (2013.01); *H01L 2924/13091* (2013.01); *H01L 2924/1431* (2013.01);
(Continued)

(58) Field of Classification Search
CPC .... H01L 23/42; H01L 23/3735; H01L 23/473
See application file for complete search history.

(56) References Cited

U.S. PATENT DOCUMENTS

| 6,845,012 B2 * | 1/2005 | Ohkouchi | ........... H01L 23/4006 257/675 |
|---|---|---|---|
| 2004/0061138 A1 | 4/2004 | Shinohara et al. | |

(Continued)

FOREIGN PATENT DOCUMENTS

| CN | 102299079 A | 12/2011 |
|---|---|---|
| CN | 105849899 A | 8/2016 |

(Continued)

*Primary Examiner* — Sarah K Salerno
(74) *Attorney, Agent, or Firm* — Murphy, Bilak & Homiller, PLLC

(57) ABSTRACT

A package which comprises at least one electronic chip, an encapsulant encapsulating at least part of the at least one electronic chip, and a shielding layer on at least part of an external surface of the encapsulant configured for shielding an interior of the package with regard to cooling fluid for removing thermal energy from the at least one electronic chip.

22 Claims, 2 Drawing Sheets

(51) Int. Cl.
*H01L 23/00* (2006.01)
*H01L 23/31* (2006.01)

(52) U.S. Cl.
CPC ............. *H01L 2924/1815* (2013.01); *H01L 2924/3025* (2013.01)

(56) References Cited

U.S. PATENT DOCUMENTS

| | | |
|---|---|---|
| 2005/0083652 A1 | 4/2005 | Jairazbhoy et al. |
| 2006/0033236 A1* | 2/2006 | Brandenburg ........ H01L 23/473 264/272.17 |
| 2006/0038284 A1* | 2/2006 | Brandenburg ........ H01L 23/473 257/714 |
| 2009/0231810 A1* | 9/2009 | Liang ................... H01L 23/473 361/699 |
| 2011/0037166 A1* | 2/2011 | Ikeda ..................... H01L 24/32 257/712 |
| 2011/0316143 A1 | 12/2011 | Noritake et al. |
| 2011/0318884 A1 | 12/2011 | Noritake et al. |
| 2013/0252381 A1 | 9/2013 | Spann et al. |
| 2014/0185243 A1 | 7/2014 | Joo et al. |
| 2015/0138734 A1 | 5/2015 | Guo |

FOREIGN PATENT DOCUMENTS

| | | |
|---|---|---|
| DE | 10322745 A1 | 4/2004 |
| DE | 102013207804 A1 | 10/2013 |
| DE | 102012218561 A1 | 4/2014 |
| DE | 102014106127 A1 | 11/2014 |
| DE | 102014106134 A1 | 11/2014 |
| DE | 112015000446 T5 | 12/2016 |
| JP | 2006310486 A | 11/2006 |
| JP | 2013179104 A | 9/2013 |
| JP | 2015230913 A | 12/2015 |
| WO | 2016067930 A1 | 5/2016 |

* cited by examiner

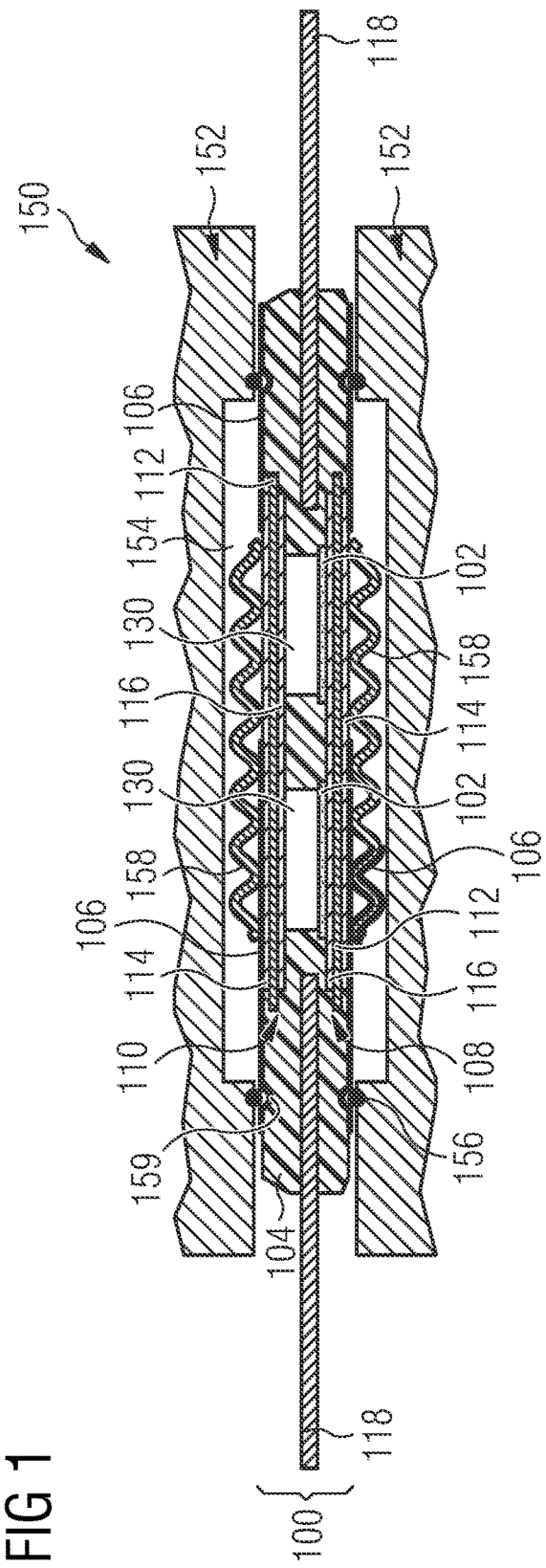
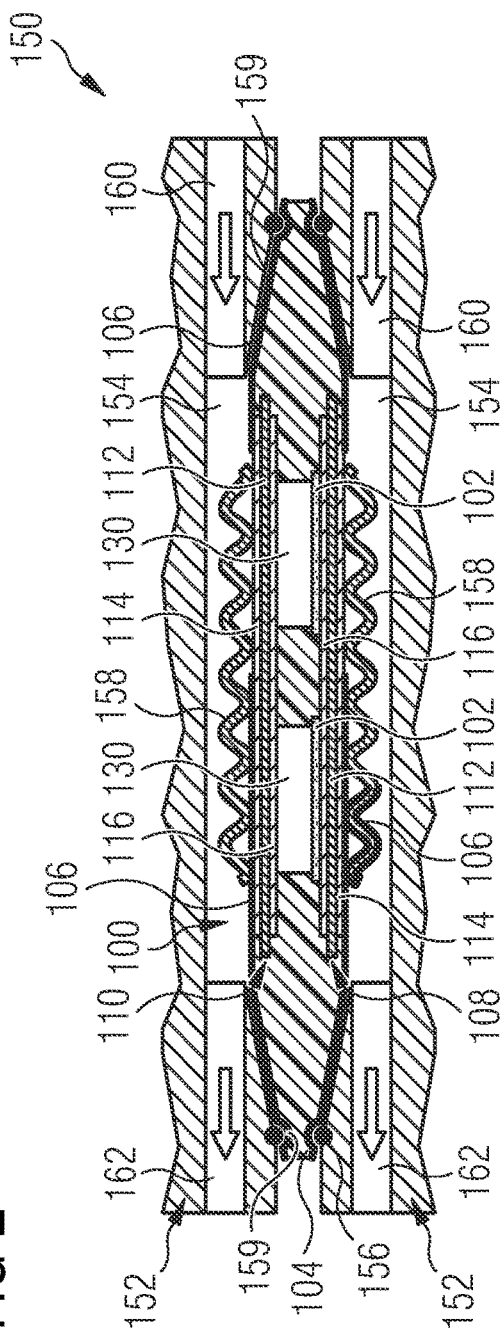

PACKAGE COOLED WITH COOLING FLUID AND COMPRISING SHIELDING LAYER

BACKGROUND OF THE INVENTION

Field of the Invention

The present invention relates to a package, to an electronic device, to a vehicle, to a method of use, and to methods of manufacturing.

Description of the Related Art

A power module, for instance for automotive applications, provides a physical containment for power components, usually power semiconductor devices in form of electronic chips comprising one or more integrated circuit components. Examples of integrated circuit components of power modules are an insulated-gate bipolar transistor (IGBT), and a diode.

There is still potentially room to improve reliability of a package while efficiently removing heat.

SUMMARY OF THE INVENTION

There may be a need for a package allowing for an efficient removal of heat generated during operation while ensuring reliability of the package.

According to an exemplary embodiment, a package is provided which comprises at least one electronic chip, an encapsulant encapsulating at least part of the at least one electronic chip, and a shielding layer on at least part of an external surface of the encapsulant configured for shielding an interior of the package with regard to cooling fluid for removing thermal energy from the at least one electronic chip.

According to another exemplary embodiment, an electronic device is provided which comprises a package having the above mentioned features, and a cooling member configured for being mounted on the package to thereby delimit, together with the package, a cooling cavity for accommodating cooling fluid for cooling the package.

According to still another exemplary embodiment, a vehicle is provided which comprises a package or an electronic device having the above mentioned features.

According to yet another exemplary embodiment, a method of manufacturing a package is provided, wherein the method comprises encapsulating at least part of at least one electronic chip by an encapsulant, and forming a shielding layer on at least part of an external surface of the encapsulant and configuring the shielding layer for shielding an interior of the package with regard to cooling fluid for removing thermal energy from the at least one electronic chip.

According to yet another exemplary embodiment, a method of manufacturing an electronic device is provided, wherein the method comprises forming a package having the above mentioned features, and mounting a cooling member on the package to thereby delimit, together with the package, a cooling cavity for accommodating cooling fluid for cooling the package.

According to yet another exemplary embodiment, a package having the above mentioned features or an electronic device having the above-mentioned features is used for an automotive application.

An exemplary embodiment may have the advantage that the removal of heat generated by the one or more electronic chips during operation of the package may be highly efficient as a consequence of a direct cooling architecture by a fluidic (i.e. liquid and/or gaseous) cooling fluid to be brought in contact with an exterior surface of the package. At the same time, the provision of a shielding layer on at least a part of the encapsulant's exterior surface which would otherwise be in direct contact with the cooling fluid (i.e. at least on the surface portion of the encapsulant contributing to the definition of the cooling cavity) may safely prevent any undesired ingress of cooling fluid into an interior of the (in particular mold-type) encapsulant material. Conventionally, such a penetration of moisture or the like into an interior of a package may result in electric instability (in particular the danger of short-circuiting) and/or mechanical instability (for instance delamination). Simultaneously and synergetically with the efficient heat removal capability and the high reliability of the package, it is thereby made possible by exemplary embodiments of the invention that the encapsulant covered by the shielding layer can define part of the cooling fluid exposed exterior surface of the package so that the surface area defined by costly materials (such as a heat removal body which may be embodied as DCB substrate) of the package can be reduced. Thus, a highly efficient cooling performance and a high reliability of the package in terms of its electrical and mechanical behaviour may be combined with a cost-efficient and simple manufacturability.

DESCRIPTION OF FURTHER EXEMPLARY EMBODIMENTS

In the following, further exemplary embodiments of the package, the electronic device, the vehicle, and the methods will be explained.

In an embodiment, the material of the shielding layer is configured to provide at least one property/function of the group consisting of:

corrosion resistance (i.e. providing protection against undesired corrosion);

impermeability for liquids (i.e. preventing ingress of a liquid into the encapsulant, in particular being waterproof);

abrasion resistance (i.e. preventing flowing cooling fluid from removing surface material of the package by abrasion); and fissure bridging capability (i.e. being capable of bridging a crack or fissure which may occur under undesired circumstances in the package, for instance as a consequence of excessive thermal or mechanical load).

In an embodiment, the material of the shielding layer comprises at least one of the group consisting of:

an organic dielectric material, in particular parylene or another plastic material;

an organic electrically conductive material, in particular an electrically conductive polymer;

an inorganic dielectric material, in particular a low-temperature glass or a ceramic; and a metallic material, in particular at least one of titanium, nickel, aluminum, titanium-nickel, titanium-aluminum, and titanium-aluminum-nickel.

However, other materials being fluid tight (in particular liquid tight) and being therefore capable of shielding the cooling fluid with regard to the encapsulant of the package may be used as well for the shielding layer(s).

In an embodiment, the package comprises a first heat removal body thermally coupled to a first main surface of the at least one electronic chip and configured for removing thermal energy from the at least one electronic chip to the cooling fluid. The first heat removal body may be partly (in particular only partly, so that the first heat removal body forms part of an exterior surface of the package, which is advantageous in terms of its heat removal capability) encapsulated by the encapsulant. In other words, the package may comprise at least one heat removal body being partially embedded in the package and partially exposed to a cooling cavity. The first heat removal body may have the function of efficiently removing heat generated by the at least one electronic chip mounted thereon. Thus, the first heat removal body may simultaneously also serve as a chip carrier.

In an embodiment, the package comprises a second heat removal body thermally coupled to a second main surface of the at least one electronic chip and/or of at least one further electronic chip of the package and configured for removing thermal energy from the at least one electronic chip and/or from the at least one further electronic chip to the cooling fluid. The second heat removal body may be partly (in particular only partly, so that the second heat removal body forms part of an exterior surface of the package, which is advantageous in terms of its heat removal capability) encapsulated by the encapsulant. The provision of a second heat removal body in addition to the first heat removal body provides the opportunity for highly efficient double-sided cooling. In one alternative (as shown for instance in FIG. 1 and FIG. 2) each of one or more electronic chips may be coupled with a respective first main surface thereof to the first heat removal body and may be coupled with the respective second main surface thereof to the second heat removal body. In another alternative (not shown in the figures), at least one electronic chip may be coupled only with the first heat removal body, and at least one other electronic chip may be coupled only with the second heat removal body. In such a configuration, the mentioned electronic chips may be arranged to face one another, whereas the heat removal bodies may be arranged to oppose one another, thereby also allowing for double sided cooling of the package.

In an embodiment, the first heat removal body (and/or an optional second heat removal body) may comprise a material having a high thermal conductivity so as to be capable of efficiently removing heat from the one or more electronic chips to an environment of the package. In particular, the thermal conductivity of at least one of the heat removal bodies as a whole or a material thereof may be at least 10 W/mK, in particular at least 50 W/mK.

In an embodiment, at least a portion of a surface of at least one of the first heat removal body and the second heat removal body is covered by part of the shielding layer(s) (i.e. by the same shielding layer(s) which also cover(s) the encapsulant) or by at least one further shielding layer (i.e. by one or more separate shielding layer(s) being different from the shielding layer(s) which cover(s) the encapsulant). In one configuration, it is highly efficient to manufacture a single common shared and seamless shielding layer covering both the encapsulant and the respective heat removal body. A scenario in which additional coverage of a respective heat removal body with a shielding layer may be desirable is a situation where undesired electrochemical interaction may occur when for example a copper surface layer of the heat removal body (for instance a copper layer of a DCB substrate) is arranged close to cooling fins made of another material such as aluminum. The shielding layer may then also function to electrochemically passivate the electrochemically active metal surface(s).

In an embodiment, the encapsulant encapsulates at least one of part of the first heat removal body and part of the second heat removal body. In such a configuration, part of the exterior surface of the package is formed by a respective one of the heat removal bodies, which results in a highly efficient heat removal (since the encapsulant usually has a smaller thermal conductivity than the heat removal body or bodies).

In an embodiment, the package comprises a chip carrier on which the at least one electronic chip is mounted. In particular, the first heat removal body may be configured as the chip carrier (in addition to its function as heat sink). For instance, at least one of the first heat removal body and the second heat removal body may be configured as at least one of the group consisting of a Direct Copper Bonding substrate (DCB), and a Direct Aluminum Bonding substrate (DAB). Alternative chip carriers which may be used for other embodiments can be any interposer like a substrate, a ceramic substrate, a laminar substrate, a leadframe, an IMS (Insulated Metal Substrate), a PCB (printed circuit board), etc.

In an embodiment, the package comprises a spacer body, in particular a thermally conductive spacer body, arranged between the electronic chip and the second heat removal body. For example, such an optional spacer body may be embodied as a copper block.

In an embodiment, at least one of the first heat removal body and the second heat removal body comprises an electrically insulating (and preferably highly thermally conductive) layer having a first main surface covered by a first electrically conductive layer and having a second main surface covered by a second electrically conductive layer. For example, the electrically insulating layer may be simultaneously highly thermally conductive, which can be accomplished for example by the provision of a ceramic layer. At least one of the electrically conductive layers may be a copper layer combining a high thermal conductivity with a high electrical conductivity. However, aluminum is also a proper material selection for at least one of the electrically conductive layers. For instance, at least one of the first heat removal body and the second heat removal body may be configured as at least one of the group consisting of a Direct Copper Bonding substrate (DCB), and a Direct Aluminum Bonding substrate (DAB).

In an embodiment, at least one of the first heat removal body and the second heat removal body comprises an electrically conductive wiring structure electrically connecting the electronic chip(s). In particular, the electrically conductive wiring structure may be one of the above-mentioned first and second electrically conductive layers, which may be patterned in accordance with a required electric coupling logic.

In an embodiment, the package comprises a cooling fin body on at least one of the first heat removal body and the second heat removal body. Such a cooling fin body may for instance be embodied by ribbon bonds of a highly thermally conductive material such as aluminum. Alternatively, such a cooling fin body may also be embodied by an array of (for instance matrix-like arranged) posts of a highly thermally conductive material such as aluminum. In an embodiment, the cooling fin body may be shaped so as to force the cooling fluid onto a nonlinear flow path, in particular for generating vortex or other kind of flow turbulence. This may improve the thermal exchange between the package and the cooling fluid.

In an embodiment, the package comprises a shielding layer on at least part of an external surface of the cooling fin body. By covering also the cooling fin body partly or completely by a shielding layer of the above described type, any undesired electrochemical interaction between a surface metal of the cooling fin and a surface metal of a respective heat removal body, etc., can be avoided.

In an embodiment, the encapsulant is covered by the shielding layer in a surface region directly adjacent to at least one of the first heat removal body and the second heat removal body. Thus, an uninterrupted surface area may be formed in which the cooling fluid is incapable of ingressing into the package, which is neither enabled by the surface portion defined by the shielding layer on the encapsulant nor enabled by the surface portion defined by the heat removal body.

In an embodiment, the package comprises an electrically conductive contact structure, in particular a leadframe, extending partially within and partially outside (in particular forming one or more exposed leads) of the encapsulant and being electrically coupled with the at least one electronic chip (for instance by wire bonding). By such an electrically conductive contact structure, the at least one electronic chip may be coupled to an electronic environment of the package. For this purpose, one or more legs of the electrically conductive contact structure may extend beyond the encapsulant. A leadframe may be a metal structure partially inside a chip package that is configured for carrying signals from the electronic chip to the outside, and/or vice versa. The electronic chip inside the package or electronic component may be attached to the leadframe, and then bond wires may be provided for attaching pads of the electronic chip to leads of the leadframe. Subsequently, the leadframe may be molded in a plastic case or any other encapsulant.

In a preferred embodiment, the encapsulant is a mold compound. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity may be embedded in an epoxy-based matrix of the encapsulant.

In an embodiment, the package comprises at least one heat removal body each thermally coupled to a respective main surface of at least one of the at least one electronic chip and configured for removing thermal energy from the respective at least one electronic chip to the cooling fluid, wherein the cooling cavity is delimited (in particular exclusively, i.e. without further cavity delimiting constituents) by the cooling member, by the shielding layer on the encapsulant (with or without sealing ring thereon) and by the at least one heat removal body (with or without shielding layer thereon). Different heat removal bodies may serve the same electronic chips (as shown in FIG. 1 and FIG. 2) or may serve different electronic chips in terms of thermally coupling them with cooling fluid. This allows for a proper heat exchange between cooling fluid and package and additionally allows to keep the dimension of the in many cases costly heat removal body or bodies small.

In an embodiment, the shielding layer on at least part of an external surface of the encapsulant is configured for shielding an interior of the package with regard to cooling fluid. For instance, such a cooling fluid can be a cooling liquid like water.

In an embodiment, the encapsulant, in particular a portion of the encapsulation covered with a shielding layer, is provided with a structural feature contributing to a cooling fluid related function. In particular, such at least one structural feature may comprise a sealing groove for accommodating a sealing member for promoting fluid-tightness of the cooling cavity, and/or may comprise a cooling fluid guiding structure for guiding the cooling fluid along a defined flow path. Thus, the provision of the shielding layer does not negatively influence the possibility of defining one or more structural features by a corresponding shaping of the encapsulant. By arranging a sealing O-ring on the shielding layer coated encapsulant rather than on a heat removal body surface, costly heat removal body surface may be saved. For instance, such a sealing O-ring may be inserted by molding. By defining flow channels by a corresponding adjustment of the shape of the encapsulant, an undesired high flow resistance of the cooling fluid may be prevented. When the cooling fluid is driven by a pump, the drive power for the pump may be thereby reduced advantageously.

In an embodiment, the cooling member is configured for being mounted on the package for double-sided cooling of the package by cooling fluid being thermally couplable with two opposing main surfaces of the package. This results in a particularly pronounced cooling performance. However, according to another exemplary embodiment, also single-sided cooling may be accomplished.

In an embodiment, the cooling member comprises at least one of a cooling medium supply channel configured for supplying cooling medium from a cooling fluid reservoir to the cooling cavity, and a cooling medium drain channel configured for draining cooling medium from the cooling cavity. The flow trajectory of cooling fluid may therefore be precisely defined. Preferably, a closed loop cooling fluid flow path may be designed.

In an embodiment, the heat removal body and the cooling member are free of a direct mutual contact. A direct contact with the heat removal body may be accomplished by the shielding layer spacing the encapsulant with regard to the cooling member.

In an embodiment, the shielding layer is manufactured by at least one of the group consisting of:
  sputtering;
  deposition (in particular chemical deposition (such as plating) or deposition by evaporation, vapor deposition);
  chemical vapor deposition (CVD);
  low-temperature melting, in particular by laser processing;
  varnishing; and
  plasma deposition.

However, other manufacturing procedures are possible as well.

In an embodiment, the method comprises conditioning the encapsulant (in particular by roughening a surface of the encapsulant) for promoting its adhesion properties prior to forming the shielding layer on the encapsulant. In particular by roughening the surface of the encapsulant before formation of the shielding layer may improve adhesion. Additionally or alternatively, waxy material may be removed from the encapsulant (such as a mold compound), also to improve adhesion.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In an embodiment, the electronic chip experiences a vertical current flow. The package architecture according to exemplary embodiments of the invention is particularly appropriate for high power applications in which a vertical current flow is desired, i.e. a current flow in a direction perpendicular to the two opposing main surfaces of the electronic chip, one of which being used for mounting the electronic chip on the carrier.

In embodiments, the electronic component may be configured as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the electronic component is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the electronic component according to an exemplary embodiment is fully compatible with standard packaging concepts (in particular fully compatible with standard TO packaging concepts) and appears externally as a conventional electronic component, which is highly user-convenient. In an embodiment, the electronic component is configured as power module, e.g. molded power module. For instance, an exemplary embodiment of the electronic component may be an intelligent power module (IPM).

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 shows a cross-sectional view of an electronic device with a double-sided cooling package according to an exemplary embodiment.

FIG. 2 shows a cross-sectional view of an electronic device with a double-sided cooling package according to another exemplary embodiment.

DETAILED DESCRIPTION OF EXEMPLARY EMBODIMENTS

Figure 3:
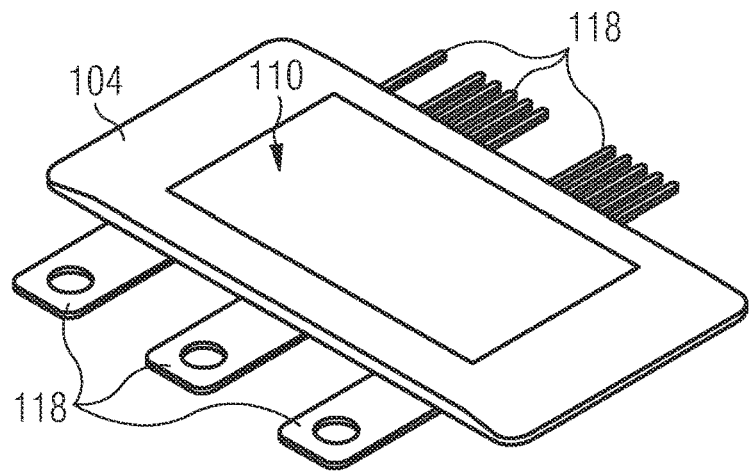
FIG. 3 shows a three-dimensional view of a double-sided cooling package without metallization according to an exemplary embodiment.

The illustration in the drawing is schematically.

Before describing further exemplary embodiments in further detail, some basic considerations of the present inventors will be summarized based on which exemplary embodiments have been developed which provide for an efficient cooling of a reliable package.

According to an exemplary embodiment of the invention, a package, in particular a molded power module, is provided which is equipped with an efficient heat removal mechanism by direct fluid (in particular liquid) cooling without any risk of undesired penetration of cooling fluid into usually not waterproof encapsulant material.

The demand for an increased compactness of packages in combination with the demand for package manufacturability with low effort brings conventional cooling concepts for removing energy generated during operation of a package to the limit. This particularly holds for molded power modules with Direct Copper Bonding (DCB) substrate used for removing heat from the encapsulated chip(s). A severe limitation is the high cost of DCB area of a package. This particularly holds for a double-sided cooling architecture where two such DCB substrates or other heat removal bodies are implemented.

An exemplary embodiment of the invention provides a package with a direct cooling configuration using a heat removal body architecture (in particular implementing one or more DCBs), preferably but not necessarily in terms of double-sided cooling, which allows efficient removal of generated heat while safely preventing any undesired intrusion of cooling fluid into a mold-type encapsulant of the package. This can be accomplished by arranging a shielding layer at least on cooling fluid exposed surface portions of the encapsulant, i.e. spatial areas of the package external surface being not formed by the heat removal body or bodies and being in physical contact with the cooling fluid during operation. In order to prevent the cooling medium from diffusing or flowing into an interior of the package or power module, the sealing shielding layer may be arranged directly on the (for instance mold compound type) encapsulant material. Advantageously, the shaping of the encapsulant may be adjusted to provide a flow guidance so as to precisely define fluidic paths along which the cooling fluid can flow.

In an embodiment, the shielding layer is a metal layer covering one or more surface portions of the encapsulant for preventing fluid communication of the cooling fluid up to the encapsulant. The shielding layer can be formed by sputtering, vapor deposition (in particular chemical vapor deposition (CVD)), melting at moderate temperature, using a laser, varnishing and/or plasma deposition. The material of the shielding layer may be an organic isolation material (such as parylene), an inorganic isolation material (such as a low-temperature glass) or a metallic layer (for instance titanium, nickel, aluminum, titanium/nickel, titanium/aluminum, titanium/aluminum/nickel, etc.).

By taking these measures, the in many cases costly material of a heat removal body (in particular a ceramic material of a DCB) may be reduced in size, since even shielding layer covered surface portions of the encapsulant can be brought in direct contact with a liquid or gaseous cooling fluid.

Moreover, one or more structures (such as indentations and/or protrusions) can be formed in the mold tool and can be manufactured without additional effort during encapsulation. Such structures are an indentation for an O-ring sealing, an indentation for cooling fluid flow path definition, etc.

According to an exemplary embodiment, a package (in particular a power module) may be provided with a direct heat removal body (in particular DCB) cooling capability, wherein the area enclosed by a cooling body may be larger than the area of the heat removal body (and may be larger than the area of one or more electronic chips and/or of one or more optional spacer bodies). A thin shielding layer may be provided which shields or seals the region of the encapsulant (in particular mold body) exposed outside of the heat removal body with regard to the cooling fluid. Advantageously, the shielding layer may be corrosion resistant and/or waterproof and/or abrasion resistant and/or fissure bridging. The shielding layer may be composed of one or several sub-layers and may enclose cooling structures (such as cooling fins) on the heat removal body. The (preferably mold-type) encapsulant may be simultaneously used for structurally defining sealing areas and/or may provide for flow guidance.

FIG. 1 shows a cross-sectional view of an electronic device 150 with a double-sided cooling package 100 according to an exemplary embodiment. The electronic device 150 is composed of a power package 100 and a two-piece cooling member 152.

The cooling member 152 is configured as a two-piece shell (i.e. comprising an upper shell and a lower shell between which the package 100 is sandwiched) for being mounted on the package 100 to thereby delimit, together with the package 100, a cooling cavity 154 for temporarily accommodating flowing cooling fluid for cooling the package 100. As can be taken from FIG. 1, the cooling member 152 is mounted on the package 100 for double-sided cooling of the package 100 by cooling fluid being thermally couplable with two opposing main surfaces of the package 100.

The package 100 according to FIG. 1 comprises two electronic chips 102 which are here embodied as power semiconductor chips. The electronic chip 102 shown on the left hand side of FIG. 1 may be a diode chip, whereas the electronic chip 102 shown on the right-hand side of FIG. 1 may be an IGBT (Insulated Gate Bipolar Transistor) chip.

A first heat removal body 108, which is here embodied as Direct Copper Bonding (DCB) substrate, is thermally and mechanically coupled to a first main surface of the electronic chips 102 and forms part of an exterior surface of the package 100. The first heat removal body 108 is configured for removing thermal energy from the electronic chips 102 during operation of the package 100 to cooling liquid (not shown, for instance water and/or an organic solvent such glycol) supplied to the cooling cavity 154 between the package 100 and the package external cooling member 152. The first heat removal body 108 comprises a central electrically insulating and thermally conductive layer 112, here made of ceramic material, having a first main surface covered by a first electrically conductive layer 114, which is here embodied as a copper layer, and having an opposing second main surface covered by a second electrically conductive layer 116, which is here embodied as a further copper layer. The electronic chips 102 are mounted and soldered on the first heat removal body 108 and may be electrically connected with the second electrically conductive layer 116 by bond wires (not shown). Hence, the first heat removal body 108 functions as a chip carrier and as a heat sink. The first electrically conductive layer 114 of the first heat removal body 108 forms part of an exterior surface of the package 100 and thereby significantly contributes to the heat removal from the electronic chips 102 during operation of the package 100.

Optional spacer bodies 130, which may be embodied as copper blocks, are soldered onto upper main surfaces of the electronic chips 102.

Moreover, a second heat removal body 110 is thermally coupled to a second main surface of the electronic chips 102 via the spacer bodies 130. Also the second heat removal body 110 comprises a central electrically insulating and thermally conductive layer 112, which may be made of a ceramic, having a first main surface covered by a first electrically conductive layer 114, which is here embodied as a copper layer, and having an opposing second main surface covered by a second electrically conductive layer 116, which is here embodied as a further copper layer. The second electrically conductive layer 116 of the second heat removal body 110 is soldered onto the spacer bodies 130. The first electrically conductive layer 114 of the second heat removal body 110 forms part of an exterior surface of the package 100 and thereby significantly contributes to the heat removal from the electronic chips 102 during operation of the package 100. As a whole, the second heat removal body 110 is configured as a heat sink for removing thermal energy from the electronic chips 102.

Hence, the heat removal bodies 108, 110 are both partially embedded in the package 100 and partially exposed to the cooling cavity 154. Furthermore, the heat removal bodies 108, 110 and the cooling member 152 are free of a direct mutual contact.

An electrically conductive contact structure 118, here embodied as a leadframe, extends partially within and partially outside of the encapsulant 104 and may be electrically coupled with the electronic chips 102 for example via a connection with the second electrically conductive layer 116 of the first heat removal body 108 (for example via a solder connection, using bond wires, etc.).

Furthermore, the package 100 comprises a mold-type encapsulant 104 encapsulating the electronic chips 102, the spacer bodies 130, only part of the electrically conductive contact structure 118, only part of the first heat removal body 108 and only part of the second heat removal body 110. The part of the electrically conductive contact structure 118 encapsulated by the encapsulant 104 serves for electrically contacting the electronic chips 102, whereas another part of the electrically conductive contact structure 118 exposed from the encapsulant 104 provides one or more leads for connection with an electronic periphery device (not shown). Since the electrically conductive contact structure 118 extends partially within and partially outside of the encapsulant 104 and is electrically coupled with the electronic chips 102, it is capable of providing an electric coupling between an exterior and an interior of the package 100.

As can be taken from FIG. 1, the package 100 may comprise one or more shielding layers 106 covering several surface portions of the encapsulant 104, which surface portions delimit part of the cooling cavity 154. The encapsulant 104 is covered by the shielding layers 106 also in surface regions directly adjacent to the first heat removal body 108 and to the second heat removal body 110. The cooling cavity 154 can be denoted as the hollow volume through which a liquid cooling fluid can be guided for cooling the package 100 during operation. Apart from the shielding layers 106, the cooling cavity 154 is also delimited by the cooling member 152 as well as by the exposed surfaces of the first heat removal body 108 and the second heat removal body 110. The shielding layers 106 may be made of a metallic material such as nickel which is configured for shielding an interior of the package 100 with regard to cooling liquid, i.e. to provide a sealing barrier preventing the cooling liquid from ingressing the interior of the package 100. In other words, the shielding layers 106 are impermeable for the cooling liquid such as water and thereby prevent that moisture enters the package 100. Thus, undesired effects (such as delamination at package internal material interfaces, reduced electrical reliability, etc.) resulting from liquid entering in particular the encapsulant 104 can be safely prevented or strongly suppressed. Advantageously, the shielding layers 106 cover the mold-type encapsulant 104 which is specifically prone for being soaked with cooling liquid such as water. As a consequence of the provision of the shielding layers 106 covering the liquid sensitive encapsulant 104, the size of the costly heat removal bodies 108, 110 may be kept small, since also the locally shielded encapsulant 104 may contribute to delimiting of the cooling cavity 154.

Moreover, portions of the encapsulant 104 covered with the shielding layers 106 are provided with a structural feature 159 contributing to a cooling fluid related function. More specifically, this structural feature 159 is a sealing groove for accommodating a sealing member 156, embodied as O-ring, for promoting fluid-tightness of the cooling cavity 152.

A respective cooling fin body 158 is arranged on each of the first heat removal body 108 and the second heat removal body 110. The cooling fin bodies 158 may be thermally highly conductive structures (for instance made of aluminum) being shaped (for instance with a zig-zag shape as shown in FIG. 1) so as to produce turbulent flow or vortex in the cooling liquid flowing along the cooling cavity 154. This improves the heat exchange between the package 100 and the cooling fluid and thereby improves the heat removal capability.

As can be taken from FIG. 1, further shielding layers 106 may cover an external surface of the cooling fin bodies 158 partly or entirely. This allows to prevent undesired electrochemical effects which may occur for example when the material of the cooling fin bodies 158 (for instance aluminum) and exposed material of the heat removal bodies 108, 110 (for instance copper) differ.

Still referring to FIG. 1, additional shielding layers 106 may be provided to cover portions of a surface of the first heat removal body 108 and the second heat removal body 110. Also this measure contributes to the suppression of undesired electrochemical effects which may occur from different uncovered metallic surfaces within the cooling cavity 154.

It should be understood that, although some of the shielding layers 106 only partly cover the respective surfaces (of the heat removal bodies 108, 110, of the cooling fin bodies 158), it is alternatively also possible that their entire surfaces are covered by shielding layers 106. Correspondingly, although the entire surfaces of the encapsulant 104 exposed within the cooling cavity 154 are covered by corresponding shielding layers 106 according to FIG. 1, it is also possible in other embodiments that these shielding layers 106 cover the mentioned surfaces only partly. In particular the heat removal bodies 108, 110 may be also completely uncovered from shielding layers 106.

FIG. 2 shows a cross-sectional view of an electronic device 150 with a double-sided cooling package 100 according to another exemplary embodiment.

According to FIG. 2, portions of the encapsulant 104 covered with the shielding layers 106 are provided with a further structural feature 159 contributing to a cooling fluid related function. More specifically, this additional structural feature 159 is a cooling fluid guiding structure or flow guiding structure for guiding the cooling fluid along a defined flow path for keeping the flow resistance small. Correspondingly, the cooling member 152 comprises cooling medium supply channels 160 configured for supplying cooling medium to the cooling cavity 154, and cooling medium drain channels 162 configured for draining cooling medium from the cooling cavity 154. Arrows in FIG. 2 indicate the flow direction of cooling liquid.

FIG. 3 shows a three-dimensional view of a preform of a double-sided cooling package 100 without metallization according to an exemplary embodiment. Thus, FIG. 3 shows a preform of package 100 after having partly embedded the heat removal bodies 108, 110 and the electrically conductive contact structure 118 in the encapsulant 104 and prior to the formation of the shielding layer(s) 106.

Figure 4:
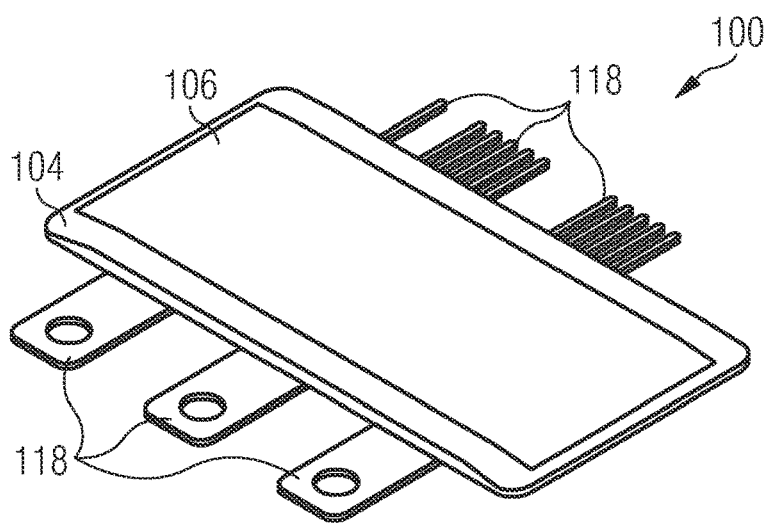
FIG. 4 shows a three-dimensional view of a double-sided cooling package with metallization according to an exemplary embodiment.

FIG. 4 shows a three-dimensional view of double-sided cooling package 100 with metallization according to an exemplary embodiment. In order to obtain the package 100 shown in FIG. 4 from the preform shown in FIG. 3, the illustrated metallic shielding layer 106 has been formed, for instance by chemical vapor deposition (CVD).

Figure 5:
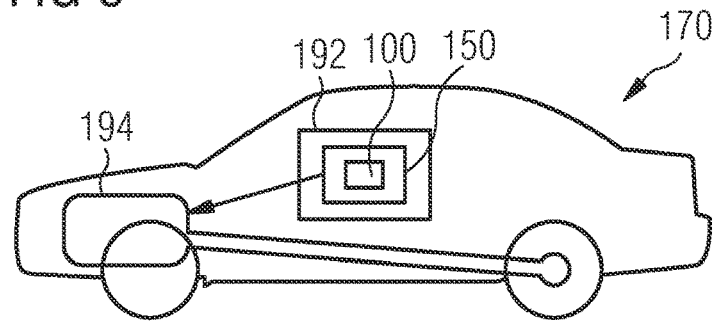
FIG. 5 shows a schematic view of a vehicle with an electronic device comprising a package according to an exemplary embodiment.

FIG. 5 shows a schematic view of a vehicle 170 with an electronic device 150 comprising a package 100 according to an exemplary embodiment.

More specifically, the power package 100 may form part of a control block 192 controlling operation of engine/battery block 194. Hence, a package 100 or power module according to an exemplary embodiment of the invention may be used for an automotive application. A preferred application of such a power package 100 is an implementation as an inverter circuit or inverted rectifier for vehicle 170 which may be an electrically driven vehicle or which may be a hybrid vehicle. Such an inverter may transfer a direct current (DC) of the battery into an alternating current (AC) for driving the electric engine of vehicle 170. In a hybrid vehicle, it is also possible to at least partially recover mechanical energy and to transfer it, by the inverter, back into electric energy to recharge the battery. In such an automotive inverter application, extreme amounts of heat are generated during operation of the power package 100. This heat can be efficiently removed by the double-sided cooling concept described above. However, it should be said that, in other embodiments, also single-sided cooling may be sufficient.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
   at least one electronic chip;
   an encapsulant encapsulating at least part of the at least one electronic chip;
   a shielding layer on at least part of an external surface of the encapsulant; and
   a first heat removal body thermally coupled to the at least one electronic chip and configured for removing thermal energy from the at least one electronic chip to a cooling fluid,
   wherein the first heat removal body comprises an electrically insulating layer having a first main surface and a second main surface opposite to the first main surface,
   wherein the first main surface is covered by a first electrically conductive layer and the second main surface is covered by a second electrically conductive layer,
   wherein the encapsulant has a surface portion that extends in a surface region extending laterally directly adjacent to the first heat removal body,
   wherein the surface portion of the encapsulant delimits part of a cooling cavity configured to guide the cooling fluid,
   wherein the shielding layer covers the surface portion of the encapsulant.

2. The package according to claim 1, wherein the material of the shielding layer is configured to provide at least one property selected from the group consisting of:
   corrosion resistance;
   impermeability for a liquid, in particular for water and/or an organic solvent such as glycol;
   abrasion resistance; and
   fissure bridging capability.

3. The package according to claim 1, wherein the material of the shielding layer comprises at least one of:
   an organic dielectric material, in particular parylene;
   an organic electrically conductive material, in particular an electrically conductive polymer;
   an inorganic dielectric material, in particular a low-temperature glass; and
   a metallic material, in particular at least one of the group consisting of titanium, nickel, aluminum, titanium-nickel, titanium-aluminum, and titanium-aluminum-nickel.

4. The package according to claim 1, further comprising a second heat removal body thermally coupled to a second main surface of the at least one electronic chip or of at least one further electronic chip of the package and configured for removing thermal energy from the at least one electronic chip or from the at least one further electronic chip to the cooling fluid.

5. The package according to claim 4, wherein at least a portion of a surface of at least one of the first heat removal body and the second heat removal body is covered by part of the shielding layer or by at least one further shielding layer.

6. The package according to claim 4, wherein the second heat removal body comprises an electrically insulating layer having a first main surface covered by a first electrically conductive layer and having a second main surface covered by a second electrically conductive layer.

7. The package according to claim 1, further comprising a cooling fin body on the first heat removal body.

8. The package according to claim 7, further comprising a shielding layer on at least part of an external surface of the cooling fin body.

9. The package according to claim 1, wherein the encapsulant is covered by the shielding layer in a surface region directly adjacent to the first heat removal body.

10. An electronic device, comprising:
    a package according to claim 1; and
    a cooling member configured for being mounted on the package to thereby delimit, together with the package, the cooling cavity for accommodating cooling fluid for cooling the package.

11. The electronic device according to claim 10, wherein the package comprises at least one heat removal body each thermally coupled to a respective main surface of at least one of the at least one electronic chip and configured for removing thermal energy from the respective at least one electronic chip to the cooling fluid, wherein the cooling cavity is delimited, in particular exclusively, by the cooling member, by the shielding layer on the encapsulant and by the at least one heat removal body with or without shielding layer thereon.

12. The electronic device according to claim 10, wherein the surface portion of the encapsulant covered with the shielding layer is shaped to form a structural feature contributing to a cooling fluid related function.

13. The electronic device according to claim 12, wherein the structural feature comprises at least one of:
    a sealing groove for accommodating a sealing member for promoting fluid-tightness of the cooling cavity; and
    a cooling fluid guiding structure for guiding the cooling fluid along a defined flow path.

14. The electronic device according to claim 10, wherein the cooling member is configured for being mounted on the package for double-sided cooling of the package by the cooling fluid being thermally couplable with two opposing main surfaces of the package.

15. The electronic device according to claim 10, wherein the cooling member comprises at least one of a cooling medium supply channel configured for supplying the cooling fluid to the cooling cavity, and a cooling medium drain channel configured for draining the cooling fluid from the cooling cavity.

16. A method of using an electronic device according to claim 10 for an automotive application, as an inverter circuit for an at least partially electrically driven vehicle.

17. A method of manufacturing an electronic device, the method comprising:
    providing a package according to claim 1; and
    mounting a cooling member on the package to thereby delimit, together with the package, the cooling cavity.

18. A vehicle, comprising a package according to claim 1.

19. A method of manufacturing a package, the method comprising:
    encapsulating at least part of at least one electronic chip by an encapsulant;
    forming a shielding layer on at least part of an external surface of the encapsulant;
    forming a first heat removal body thermally coupled to the at least one electronic chip and configured for removing thermal energy from the at least one electronic chip to a cooling fluid,
    wherein the first heat removal body comprises an electrically insulating layer having a first main surface and a second main surface opposite to the first main surface, wherein the first main surface is covered by a first electrically conductive layer and the second main surface is covered by a second electrically conductive layer, wherein the encapsulant has a surface portion that extends in a surface region extending laterally directly adjacent to the first heat removal body, wherein the surface portion of the encapsulant delimits part of a cooling cavity configured to guide the cooling fluid, wherein forming the shielding layer on at least part of the external surface of the encapsulant comprises covering the surface portion of the encapsulant that delimits part of the cooling cavity with the shielding layer.

20. The method according to claim 19, wherein the shielding layer is manufactured by at least one of:
sputtering;
deposition, in particular chemical deposition, such as plating, or deposition by evaporation;
chemical vapor deposition;
low-temperature melting, in particular by laser processing;
varnishing; and
plasma deposition.

21. The method according to claim 19, further comprising roughening the surface portion of the encapsulant, prior to covering the surface portion of the encapsulant that delimits part of the cooling cavity with the shielding layer.

22. An electronic device, comprising:
a package comprising a chip carrier, an electronic chip mounted to a first side of the chip carrier, an encapsulant that encapsulates at least part of the electronic chip, and a shielding layer on at least part of an external surface of the encapsulant; and
a cooling member comprising an upper shell and a lower shell between which the package is sandwiched,
wherein the cooling member together with the package delimits a cooling cavity configured to accommodate a cooling fluid for cooling the package,
wherein the shielding layer covers a surface portion of the encapsulant that faces the upper shell and/or the lower shell of the cooling member, the surface portion of the encapsulant delimiting part of the cooling cavity,
wherein the shielding layer is configured to prevent the cooling liquid from soaking the encapsulant.

* * * * *